(12) United States Patent
Naganuma

(10) Patent No.: US 10,423,260 B2
(45) Date of Patent: Sep. 24, 2019

(54) DISPLAY DEVICE WITH INPUT FUNCTION

(71) Applicant: Japan Display Inc., Tokyo (JP)

(72) Inventor: Tomohiko Naganuma, Tokyo (JP)

(73) Assignee: Japan Display Inc., Tokyo (JP)

( * ) Notice: Subject to any disclaimer, the term of this patent is extended or adjusted under 35 U.S.C. 154(b) by 1 day.

(21) Appl. No.: 15/811,800

(22) Filed: Nov. 14, 2017

(65) Prior Publication Data
US 2018/0150164 A1 May 31, 2018

(30) Foreign Application Priority Data

Nov. 30, 2016 (JP) .................................. 2016-233084

(51) Int. Cl.
*G06F 3/041* (2006.01)
*H01L 51/52* (2006.01)
(Continued)

(52) U.S. Cl.
CPC .......... *G06F 3/0412* (2013.01); *G06F 3/0414* (2013.01); *G06F 3/0416* (2013.01);
(Continued)

(58) Field of Classification Search
CPC .... G06F 3/0412; G06F 3/0416; G06F 3/0414; G06F 2203/04103; G06F 2203/04102; H01L 51/5221; H01L 51/5209; H01L 51/5225; H01L 51/0097; H01L 51/0023; H01L 51/001; H01L 51/56;
(Continued)

(56) References Cited

U.S. PATENT DOCUMENTS

2014/0028616 A1* 1/2014 Furutani ................. G06F 3/044
345/174
2015/0200235 A1* 7/2015 Wang .................. H01L 27/3225
257/40
(Continued)

FOREIGN PATENT DOCUMENTS

JP 2015-187851 A 10/2015

OTHER PUBLICATIONS

Jin et al.; Multi-Level-Pressure Touch Sensors with P(VDF-TrFE) Deposited on Metal Oxide Thin Film Transistor; May 25, 2016 (Year: 2016).*
Taiyu Jin et al., "Multi-Level-Pressure Touch Sensors with P(VDF-TrFE) Deposited on Metal Oxide Thin Film Transistor," SID Symposium Digest of Technical Papers, May 25, 2016, pp. 621-624, vol. 47, Issue 1, San Francisco, CA.

*Primary Examiner* — Brent D Castiaux
(74) *Attorney, Agent, or Firm* — Michael Best & Friedrich LLP

(57) ABSTRACT

A display device with an input function including a substrate, a plurality of pixels arranged above the substrate, a light emitting element including a first electrode, a second electrode and an organic layer between the first electrode and the second electrode each arranged in the plurality of pixels, and a sensor part including the second electrode, a first inorganic insulating layer arranged above the second electrode, a piezoelectric layer arranged above the first inorganic insulating layer, a second insulating layer arranged above the piezoelectric layer, and a third electrode arranged above the second inorganic insulating layer, wherein the plurality of pixels and the sensor part are arranged overlapping each other, and the second electrode is shared by the plurality of pixels and the sensor part.

15 Claims, 13 Drawing Sheets

(51) Int. Cl.
*H01L 27/32* (2006.01)
*H01L 51/00* (2006.01)
*H01L 51/56* (2006.01)

(52) U.S. Cl.
CPC ........ *H01L 27/323* (2013.01); *H01L 27/3276* (2013.01); *H01L 51/0097* (2013.01); *H01L 51/5209* (2013.01); *H01L 51/5221* (2013.01); *H01L 51/5225* (2013.01); *G06F 2203/04102* (2013.01); *G06F 2203/04103* (2013.01); *H01L 27/3246* (2013.01); *H01L 27/3258* (2013.01); *H01L 51/001* (2013.01); *H01L 51/0023* (2013.01); *H01L 51/56* (2013.01); *H01L 2227/323* (2013.01); *H01L 2251/5315* (2013.01); *H01L 2251/5338* (2013.01)

(58) Field of Classification Search
CPC ............... H01L 27/3276; H01L 27/323; H01L 27/3258; H01L 27/3246; H01L 2227/323; H01L 2251/5338; H01L 2251/5315
See application file for complete search history.

(56) References Cited

U.S. PATENT DOCUMENTS

2015/0261332 A1* 9/2015 Nakamura ............ G06F 3/0412
   345/173
2015/0378493 A1* 12/2015 Kano ...................... G06F 3/044
   345/173

* cited by examiner

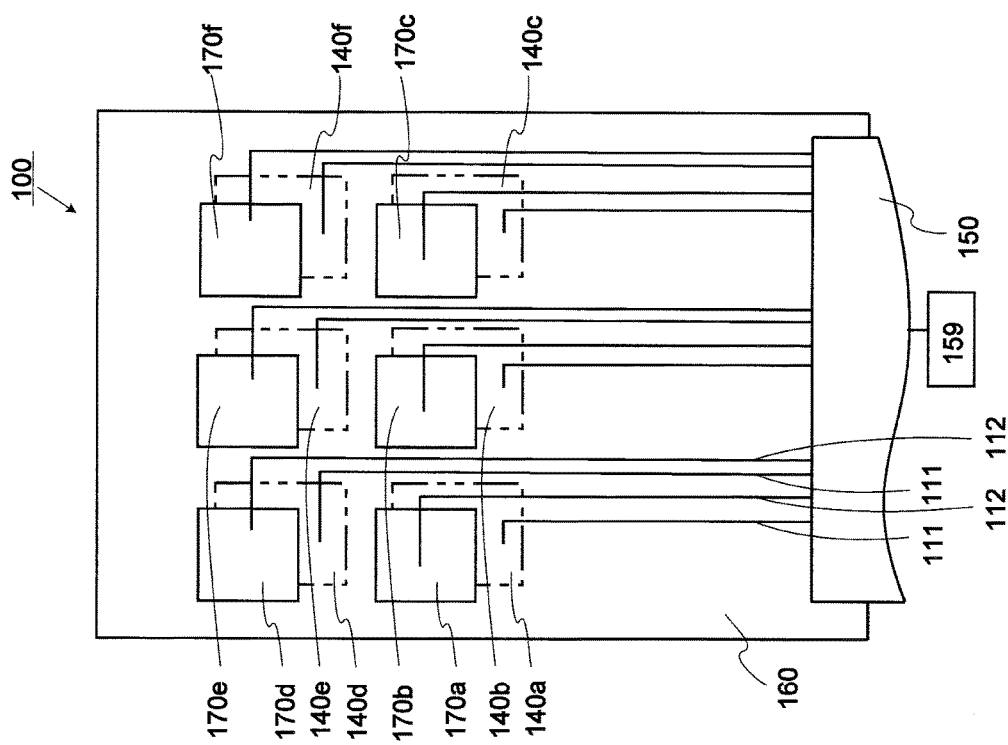

DISPLAY DEVICE WITH INPUT FUNCTION

CROSS REFERENCE TO RELATED APPLICATIONS

This application is based upon and claims the benefit of priority from the prior Japanese Patent Application No. 2016-233084, filed on Nov. 30, 2016, the entire contents of which are incorporated herein by reference.

FIELD

The present invention is related to a display device with an input function including a light emitting element.

BACKGROUND

As one aspect of a display device (hereinafter also called an "organic EL display device") using an organic electroluminescent element (hereinafter also called a "light emitting element"), a so-called flexible display has been developed using a substrate having flexibility such as plastic.

For example, Japanese Laid Open Patent Publication No. 2015-187851 discloses a flexible display arranged with a touch sensor on a flexible display, that can be bent or folded and including an input function.

SUMMARY

A display device with an input function according to one embodiment of the present invention includes a substrate, a plurality of pixels arranged above the substrate, a light emitting element including a first electrode, a second electrode and an organic layer between the first electrode and the second electrode each arranged in the plurality of pixels, and a sensor part including the second electrode, a first inorganic insulating layer arranged above the second electrode, a piezoelectric material layer arranged above the first inorganic insulating layer, a second insulating layer arranged above the piezoelectric material layer, and a third electrode arranged above the second inorganic insulating layer, wherein the plurality of pixels and the sensor part are arranged overlapping each other, and the second electrode is shared by the plurality of pixels and the sensor part.

BRIEF DESCRIPTION OF DRAWINGS

FIG. 7B is a wiring diagram of a mutual-capacitance type display device with a wiring function related to one embodiment of the present invention;

DESCRIPTION OF EMBODIMENTS

The embodiments of the present invention are explained below while referring to the diagrams. However, it is possible to perform the present invention using various different forms, and the present invention should not be limited to the content described in the embodiments exemplified herein. In addition, although the width, thickness and shape of each component are sometimes shown schematically compared to their actual form in order to better clarify explanation, the drawings are merely an example and should not limit an interpretation of the present invention. In addition, in the specification and each drawing, the same reference symbols are attached to similar elements and elements that have been mentioned in previous drawings, and therefore a detailed explanation may be omitted where appropriate.

In the present specification, in the case where certain parts or regions are given as "above (or below)" other parts or regions, as long as there is no particular limitation, these include parts which are not only directly above (or directly below) other parts or regions but also in an upper direction (or lower direction). That is, in the case where certain parts or regions are given as "above (or below)" other parts or regions, other structural elements may be included between other parts or regions in an upper direction (or lower direction).

One embodiment of the present invention is related to a display device with an input function. As described above, the flexible display disclosed in Japanese Laid Open Patent Application Publication No. 2015-187851 requires an electrode such as an anode and a cathode in a light emitting element which forms a pixel, and an electrode is further necessary for forming a touch sensor in order to add an input function. Therefore, a layer structure needs to be multilayered as compared to a conventional structure which increases manufacturing costs. In the embodiments exemplified below, compared with the conventional display device a layer structure is simplified and a display device with an input function to which a new function is added is explained.

<Embodiment 1>

Figure 1:
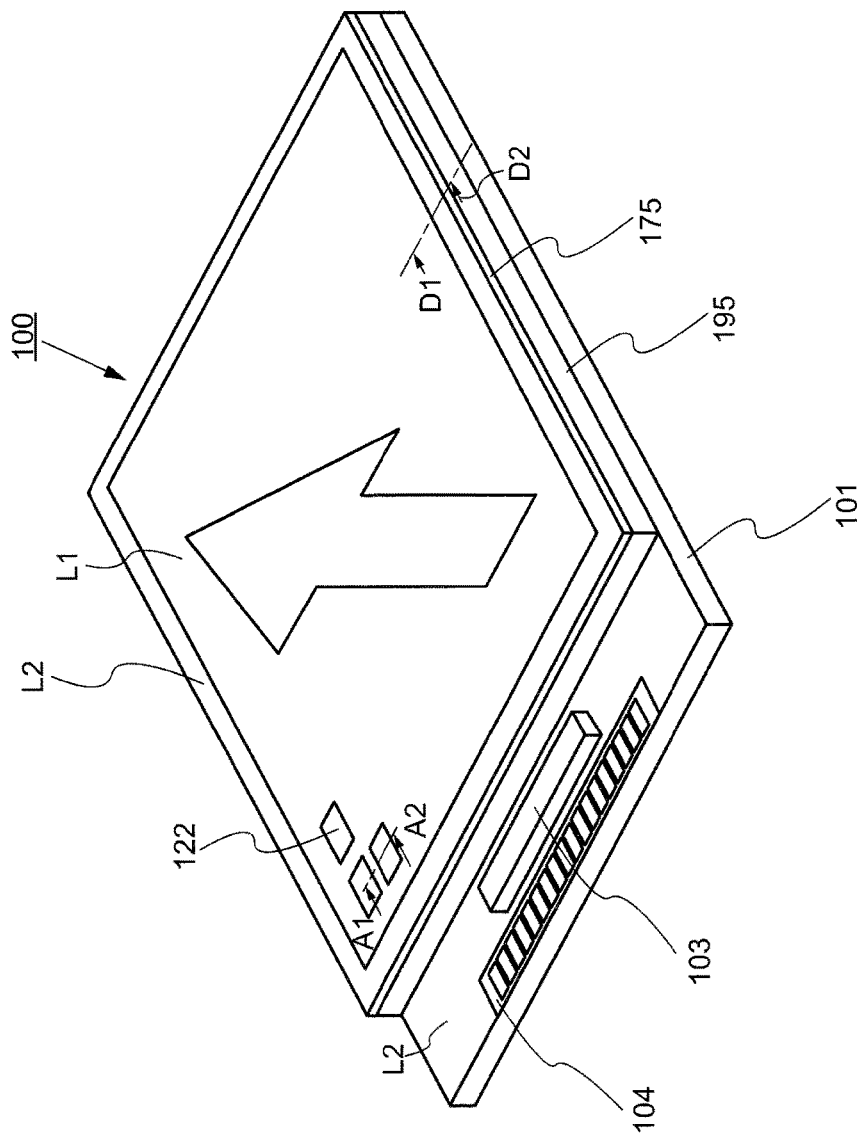
FIG. 1 is a perspective view diagram of a display device with an input function related to a first embodiment of the present invention.

FIG. 1 is a perspective view of a display device with an input function 100. FIG. 1 shows one mode before the display device with an input function 100 is bent. The display device with an input function 100 includes a substrate 101, a light emitting element 105 arranged above the substrate 101, a display layer part 195 and a filler material 175 arranged above the display layer part 195 (a transistor layer to be described later and a part of the light emitting element are not shown in the diagram). In addition, the display device with an input function 100 comprises a display region L1 and a non-display region L2 that is separate from the display region L1.

The display region L1 includes a region in which pixels 122 are arranged in a row direction and a column direction. The display region L1 is arranged on one main surface of the substrate 101. The non-display region L2 is on one main surface of the same substrate 101 and is arranged on the outer side of the display region L1. The display region L1 is covered by the display layer part 195 and the filler material 175. A drive circuit 103 and a terminal part 104 are arranged in the non-display region L2.

Figure 2:
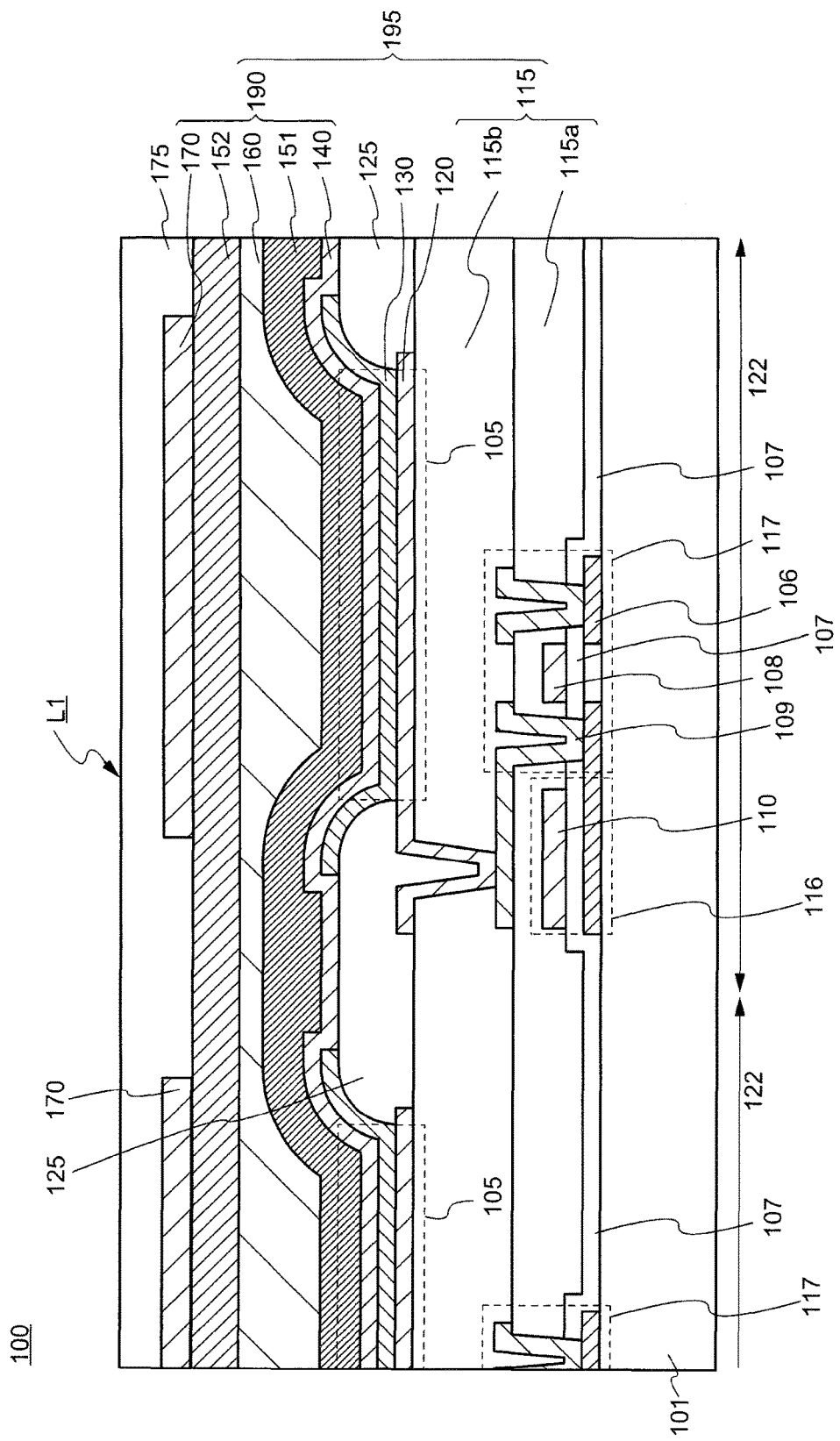
FIG. 2 is a cross-sectional diagram of a pixel related to a first embodiment of the present invention.

FIG. 2 is a cross-sectional diagram along the line A1-A2 in FIG. 1. As is shown in FIG. 2, a pixel 122 includes a transistor 117, a capacitor element 116 and a light emitting element 105. The transistor 117 and the light emitting element 105 are electrically connected. Light emission of the light emitting element 105 is controlled by the transistor 117. The capacitor 116 is appropriately arranged, for example, to hold a gate voltage of the transistor 117. In FIG. 2, an example is shown in which one third electrode 170 is arranged for one pixel 122 for the purpose of promoting understanding. Since the third electrode 170 is also used as an electrode of a touch sensor of the display device with an input function according to one embodiment of the present invention, actually, the size of the third electrode 170 is larger than the size of one pixel 122 and may be arranged to overlap a plurality of pixels.

A first inorganic insulating layer 151 and a second inorganic insulating layer 152 are arranged on an upper surface of the light emitting element 105. The first inorganic insulating layer 151 and the second inorganic insulating layer 152 are used as a protective film for preventing moisture entering into the light emitting element 105 and the piezoelectric material layer 160 described later. Therefore, the first inorganic insulating layer 151 and the second inorganic insulating layer 152 are arranged to at least cover substantially the entire surface of the display region L1. The piezoelectric material layer 160 is arranged between the first inorganic insulating layer 151 and the second inorganic insulating layer 152.

In the present specification, the piezoelectric material layer 160 indicates a layer including at least a part of a piezoelectric material or a layer formed of a piezoelectric material. The third electrode 170 is arranged above the second inorganic insulating layer 152. The third electrode 170 is arranged as a plurality of independent electrodes in the display region L1. The third electrode 170 and the second electrode 140 are arranged facing each other. The second electrode 140, the first inorganic insulating layer 151, the piezoelectric material layer 160, the second inorganic insulating layer 152 and the third electrode 170 are stacked to form the sensor part 190. The sensor part 190 includes at least one sensor element. The sensor element is formed in a region where the piezoelectric material layer 160 is sandwiched between the third electrode 170 and the second electrode 140 and where the third electrode 170 and the second electrode 140 are opposed. By arranging the third electrode 170 as a plurality of independent electrodes, a plurality of sensor elements are arranged in the sensor part 190.

A flexible member is used for the substrate 101. For example, an organic resin material is used as a member for forming the substrate 101. A polymeric material is preferably used as the organic resin material. For example, it is preferred to use polyimide having high heat resistance and excellent mechanical properties and chemical properties. Specifically, it is possible to use a substrate in which polyimide is molded into a sheet shape as the substrate 101.

Furthermore, a metal thin plate substrate or a thin substrate of glass, or a composite substrate of a varnish method in which a resin material is coated and fired to these thin film substrates, or a resin film applied to a bonded film type composite substrate can be used as other members applicable to the substrate 101.

The transistor 117 has a structure in which a semiconductor layer 106, a gate insulating layer 107 and a gate electrode 108 are stacked. The semiconductor layer 106 is formed by amorphous or polycrystalline silicon or an oxide semiconductor and the like. A source or drain electrode 109 is arranged above the gate electrode 108 with a first insulating layer 115a interposed therebetween. A second insulating layer 115b is arranged above the source or drain electrode 109 as a planarization layer.

The second insulating layer 115b has a substantially flat surface and buries the source or drain electrode 109, a contact hole arranged in the first insulating layer 115a, unevenness of the first insulating layer 115a due to the shape of the gate electrode 108 and the shape of the semiconductor layer 106. The second insulating layer 115b may have a flat surface formed by an etching process and a chemical mechanical abrasion process of the surface of an inorganic insulating layer. In addition, the second insulating layer 115b may have a flat surface which is leveled before coating or depositing a composition including a precursor such as acrylic or polyimide.

The capacitor element 116 is formed in a region where the semiconductor layer 106 and the first capacitor electrode 110 overlap with the gate insulating layer 107 as a dielectric layer. In addition, the capacitor element 116 is also formed in a region where the source or drain electrode 109 and a first capacitor electrode 110 are sandwiched with the first insulating layer 115a as the dielectric layer.

The first electrode 120 is arranged above the insulating layer 115 on the substrate 101. Here, the first electrode 120 is an anode electrode. In the case where the organic layer 130 is stacked in the order of a hole injection layer, light emitting layer and electron injection layer, it is preferred that the first electrode 120 use ITO (Indium Tin Oxide) or IZO (Indium Zinc Oxide) having excellent hole injection properties. ITO is a kind of light-transmitting conductive material and while having high transmittance in the visible light band, also has a very low reflectance. As a result, in order to add a function for reflecting light to the first electrode 120, it is preferred to stack a metal layer of aluminum (Al) or silver (Ag) and the like with the light-transmitting conductive material.

The organic layer 130 is arranged above the first electrode 120. The organic layer 130 is a layer including a light emitting material such as an organic electroluminescent material. The organic layer 130 is formed using a low molecular or high molecular weight organic material.

In the case of using a low molecular weight organic material, the organic layer 130 may be formed including a hole injection layer and an electron injection layer to sandwich the light emitting layer in addition to the light emitting layer including a light emitting organic material. In addition, the organic layer 130 may further be formed including a hole transport layer and an electron transport layer and the like. In addition to the hole injection layer and the electron injection layer, the organic layer 130 may appropriately have a hole transport layer, an electron transport layer, a hole block layer and an electron block layer and the like.

The second electrode 140 is arranged above the organic layer 130. Here, the second electrode 140 is a cathode electrode of the light emitting element 105 and also an electrode which comprises a touch sensor. Since the second electrode 140 transmits light emitted by the organic layer 130, it is preferred that the second electrode 140 is formed from a transparent conductive film such as ITO or IZO which have transparency and conductivity.

The stack of the first electrode 120, the organic layer 130 and the second electrode 140 described above is a so-called top emission type structure in which light emitted from the organic layer 130 is radiated to the second electrode 140 side. Light emission in the organic layer 130 is controlled by controlling a potential between the first electrode 120 and the second electrode 140. In addition, in the display region L1, a bank 125 is arranged to cover a periphery part of the first electrode 120 and to expose an inner region of the first electrode 120. The second electrode 140 is arranged on an upper surface of the organic layer 130 and an upper surface of the bank 125.

For example, the bank 125 is formed from an organic resin material such as an acrylic or a polyimide.

The first inorganic insulating layer 151 is arranged above the organic layer 130 and the second electrode 140. The first inorganic insulating layer 151 is arranged to cover the organic layer 130 and to prevent the entry of moisture and the like. It is preferred that the first inorganic insulating layer 151 has light-transmitting characteristics. For example, the first inorganic insulating layer 151 is formed from silicon nitride and aluminum oxide and the like.

The piezoelectric material layer 160 is arranged above the first inorganic insulating layer 151. The piezoelectric material layer 160 is a material in which a dielectric constant changes when pressure is applied. Here, the piezoelectric material layer 160 is formed from a polyvinylidene fluoride or a polylactic acid. Furthermore, the material of the piezoelectric material layer 160 is not limited to the materials disclosed here and may be formed from other materials.

In the present embodiment, the principles of pressing and bending detection is as follows. When pressure is not applied, there is no polarization inside the piezoelectric material layer 160. In addition, when pressure is not applied, a certain capacitance is generated between the second electrode 140, the first inorganic insulating layer 151, the piezoelectric material layer 160, the second inorganic insulating layer 152 and the third electrode 170. On the other hand, when pressure is applied, polarization occurs inside the piezoelectric material layer 160. In this way, a dielectric constant of the piezoelectric material layer 160 changes. Therefore, a capacitance between the second electrode 140, the first inorganic insulating layer 151, the piezoelectric material layer 160, the second inorganic insulating layer 152 and the third electrode 170 changes.

By detecting this change in capacitance using the second electrode 140 and the third electrode 170 (or just the third electrode 170), it is possible to detect that pressure has been applied. The method of applying pressure may be a pushing motion or a bending motion for example. Therefore, this sensor element can be adopted as a pressure sensor (pressure-sensitive sensor) and a bending sensor.

For example, in the present embodiment, in order to recognize that a pressing has been applied when a capacitance has changed by a first sensor element and recognize that a bending force has been applied when a capacitance has changed by a second sensor element, if a display device with an input function is designed, it becomes a display device with an input function having two types of sensor. For example, in the present embodiment, the display device with an input function may recognize that pressing is applied when the capacitance of a sensor element increases within the display region L1, and may detect the pressing amount. In addition, in the present embodiment, the display device with an input function may recognizes that bending is applied when the capacitance of the sensor element increases within the non-display region L2, and may detect the amount of bending.

Alternatively, in the present embodiment, the display device with an input function may recognize that pressing is applied when the capacitance of a sensor element within the display region L1 increases with a value less than a first capacitance value. And also, in the present embodiment, the display device with an input function may recognize that bending is applied when the capacitance of the sensor element within the display region L1 increases with a value more than a first capacitance value. Alternatively, in the present embodiment, the display device with an input function may recognize that pressing is applied when the capacitance of a sensor element within the non-display region L2 increases with a value less than a first capacitance value. And also, in the present embodiment, the display device with an input function may recognize that bending is applied when the capacitance of the sensor element within the non-display region L2 increases with a value more than a first capacitance value.

The second inorganic insulating layer 152 is arranged above the piezoelectric material layer 160. The piezoelectric material layer 160 is sandwiched between the first inorganic insulating layer 151 on the lower side and the second inorganic insulating layer 152 on the upper side. Here, the first inorganic insulating layer 151 and the second inorganic insulating layer 152 are formed without in contact with each other in a pixel 122.

However, the present invention is not limited to this embodiment. Although described later in FIG. 4, the end part of the first inorganic insulating layer 151 and the end part of the second inorganic insulating layer 152 are continuously formed and a structure in which the first inorganic insulating layer 151, and the second inorganic insulating layer 152 surround the piezoelectric material layer 160 is also possible. That is, a structure in which an inorganic insulating layer in which the first inorganic insulating layer 151 and the second inorganic insulating layer 152 are integrated may surround the piezoelectric material layer 160 is also possible. By adopting such a structure, even if any one of the piezoelectric material layers 160 of adjacent pixels deteriorates due to moisture, it is possible to suppress deterioration of the adjacent piezoelectric material layer 160.

The first inorganic insulating layer 151 and the second inorganic insulating layer 152 have a function for suppressing deterioration due to moisture of a layer inside the first inorganic insulating layer 151 and the second inorganic insulating layer 152 or a material further to the interior than the first inorganic insulating layer 151 and the second inorganic insulating layer 152. As is shown in FIG. 2, it is possible to suppress deterioration of the piezoelectric material layer 160 due to moisture by arranging the second inorganic insulating layer 152 above the piezoelectric material layer 160. In one embodiment of the present invention, since the first inorganic insulating layer 151 is further arranged between the piezoelectric material layer 160 and the second electrode 140, it is possible to suppress deterioration due to moisture of the organic layer 130 using the second inorganic insulating layer 152 and the first inorganic insulating layer 151.

The third electrode 170 is arranged above the second inorganic insulating layer 152. Here, the third electrode 170 is a receiving electrode Rx. A filler material 175 is arranged above the second inorganic insulating layer 152 and the third electrode 170. A sensor part 190 is comprised by the second electrode 140, the first inorganic insulating layer 151, the piezoelectric material layer 160, the second inorganic insulating layer 152 and the third electrode 170. The sensor part 190 and the pixel 122 described above are arranged to overlap each other. The second electrode 140 is shared by a pixel 122 and the sensor part 190.

Figure 3:
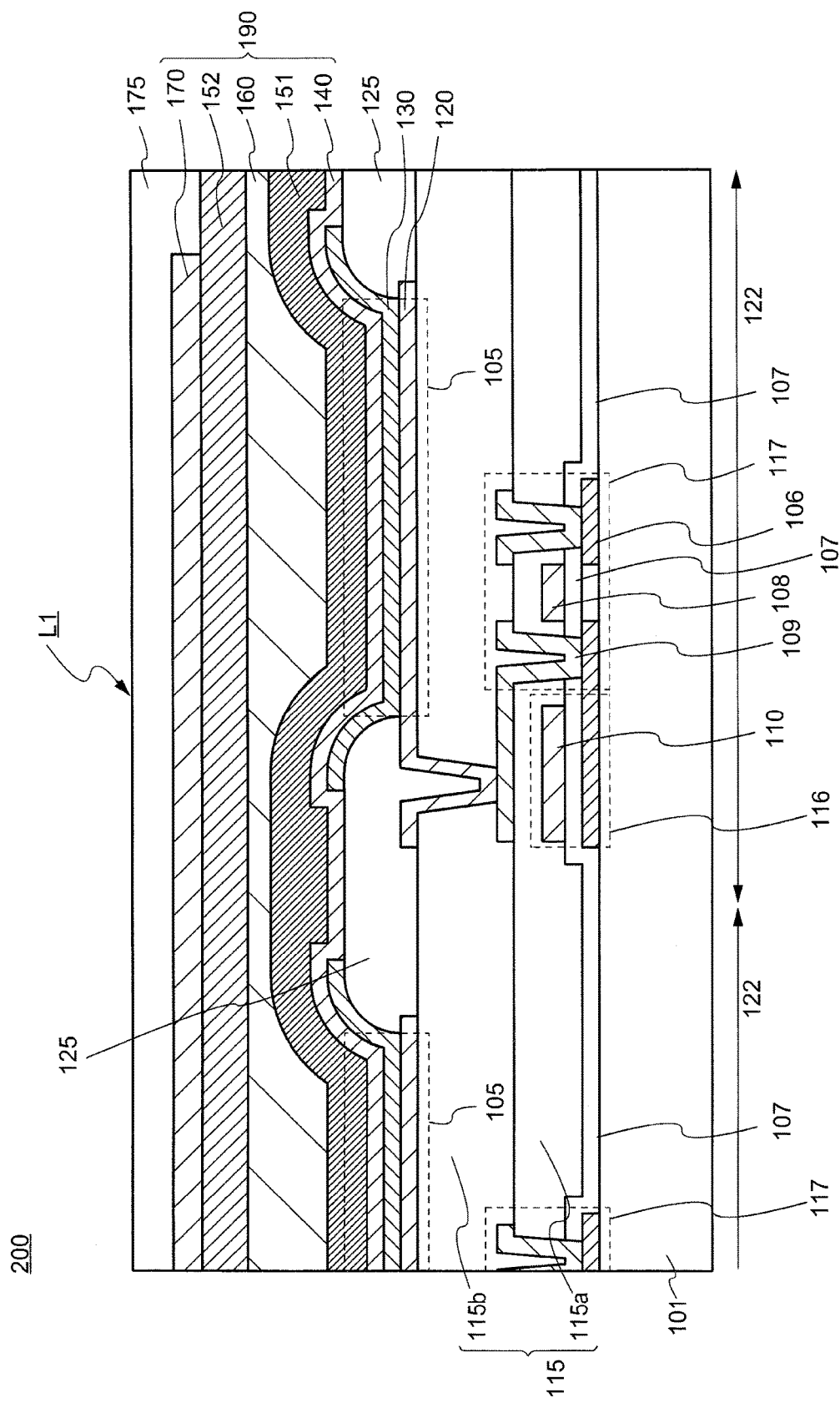
FIG. 3 is a cross-sectional diagram showing of a display device with an input function related to a modified example of the present invention.

FIG. 3 is a cross-sectional diagram showing a display device with an input function 200 according to a modified example of the present invention. As is shown in FIG. 3, in the display device with an input function 200, the third electrode 170 is arranged above a plurality of pixels 122. Although one third electrode 170 is arranged in one pixel 122 in FIG. 2, in FIG. 3 an example is shown in which the third electrode 170 is arranged provided across a plurality of pixels. In addition, FIG. 3 shows an example in which the third electrode 170 has a width (vertical width and horizontal width) across a plurality of pixels. Furthermore, a plurality of the third electrodes 170 may be arranged in one pixel 122. Similar to the display region L1, the non-display region L2 may have a width across a plurality of pixels. Furthermore, the width across the plurality of pixels explained here means either one of either the vertical width and the horizontal width. Furthermore, the second electrode 140 is also arranged across a plurality of pixels 122, and the second electrode 140 is shared by a plurality of pixels 122 and a sensor part 190.

1. Second Electrode in Both a Display Region and Non-display Region

Figure 7A:
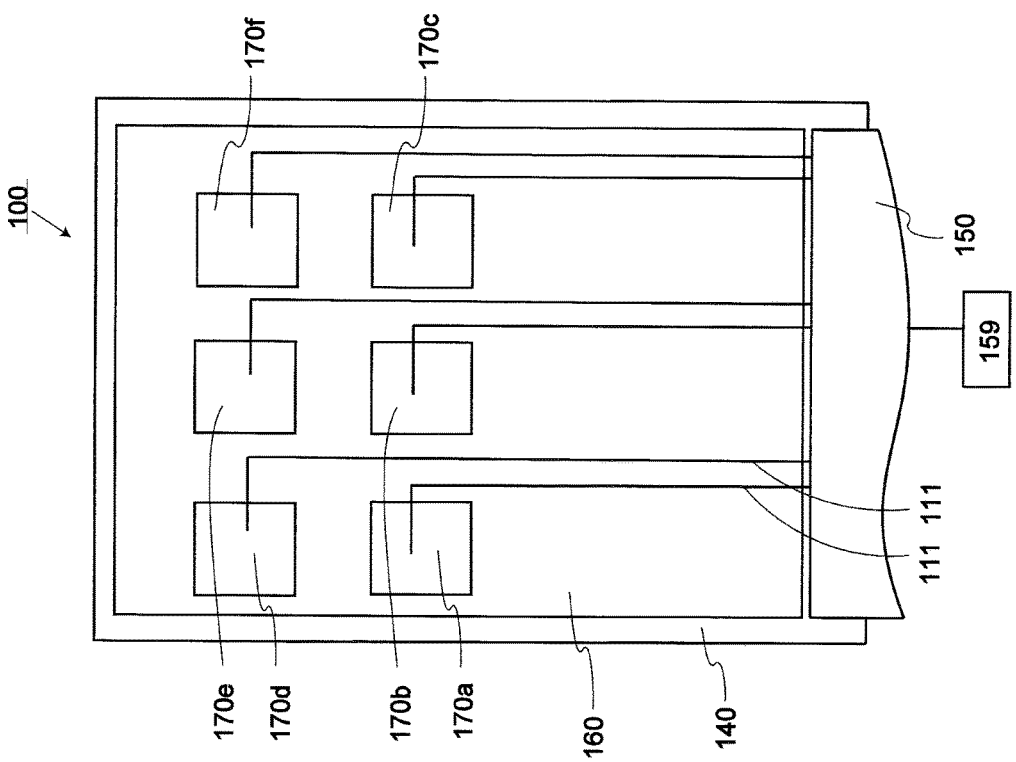
FIG. 7A is a wiring diagram of a self-capacitance type display device with a wiring function related to one embodiment of the present invention.

The second electrode 140 and the third electrode 170 may have a mutually opposing structure with the piezoelectric material layer 160 interposed therebetween in a region with a size corresponding to one pixel of the display region L1. Alternatively, the second electrode 140 and the third electrode 170 may have a mutually opposing structure with the piezoelectric material layer 160 interposed therebetween in a region with a size corresponding to a plurality of pixels of the display region L1. Details will be described later with reference to FIG. 7A and FIG. 7B. The case where the second electrode 140 is arranged on the entire surface of the display device with an input function 100 is shown in FIG. 7A, while the case where the second electrode 140 is partially arranged by patterning on the display device with an input function 100 is shown in FIG. 7B. Furthermore, the non-display region L2 may also have a width across a plurality of pixels the same as the display region L1. Furthermore, the width of the plurality of pixels described here means either one of a vertical width and horizontal width.

The second electrode 140 and the third electrode 170 may be formed by a transparent member. Since light is irradiated from the organic layer 130, it is possible to visually recognize the display device with input function 100 from exterior by forming the second electrode 140 and the third electrode 170 with a transparent member.

Figure 4:
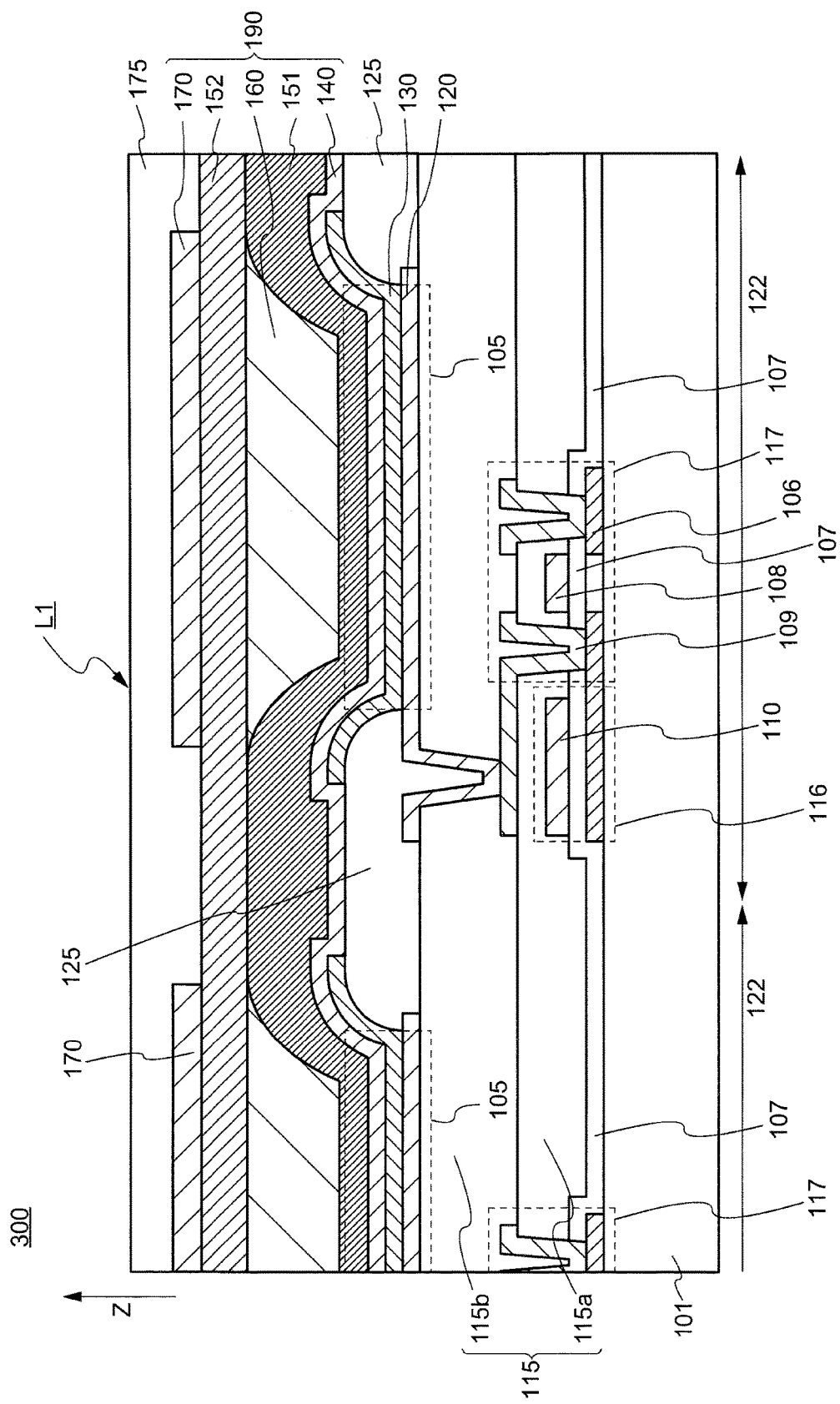
FIG. 4 is a cross-sectional diagram showing of a display device with an input function related to a modified example of the present invention.

FIG. 4 is a cross-sectional diagram of a display device with an input function 300 according to a modified example of the present invention. In the display device with an input function 300, it is different from the previous embodiment in that the piezoelectric material layer 160 surrounded by the first inorganic insulating layer 151 and the second inorganic insulating layer 152 are in contact between pixels. That is, in the display device with an input function 300, the periphery of the piezoelectric material layer 160 for each pixel 122 is surrounded by the inorganic insulating layers (the first inorganic insulating layer 151 and the second inorganic insulating layer 152).

Figure 5:
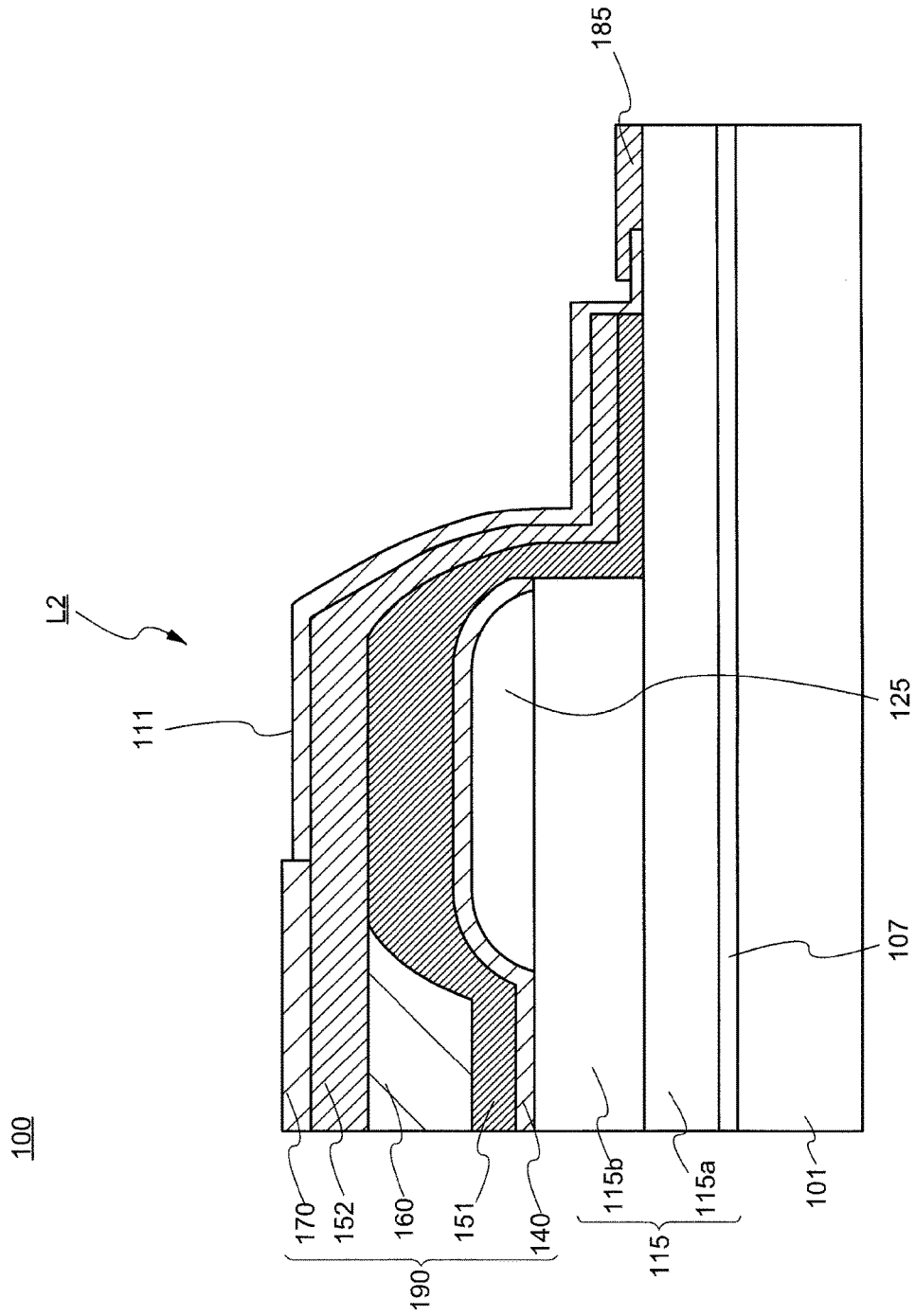
FIG. 5 is a cross-sectional diagram showing a connection state between routing wiring attached to a third electrode and a pad when a second electrode, piezoelectric material layer and third electrode are arranged.

FIG. 5 is a cross-sectional diagram view showing a connection state between routing wiring 111 attached to the third electrode 170 and a pad 185 when the second electrode 140, the piezoelectric material layer 160 and the third electrode 170 are arranged.

As is shown in FIG. 5, on the substrate 101, the piezoelectric material layer 160 is interrupted in the middle from the left end to the right end in FIG. 5, and the second inorganic insulating layer 152 and the first inorganic insulating layer 151 are in contact. In addition, in the right side of FIG. 5, the inorganic insulating layer 152 and the inorganic insulating layer 151 are no longer present, and the pad 185, the third electrode 170, and the routing wiring 111 are in contact with each other on the substrate 101.

Figure 6:
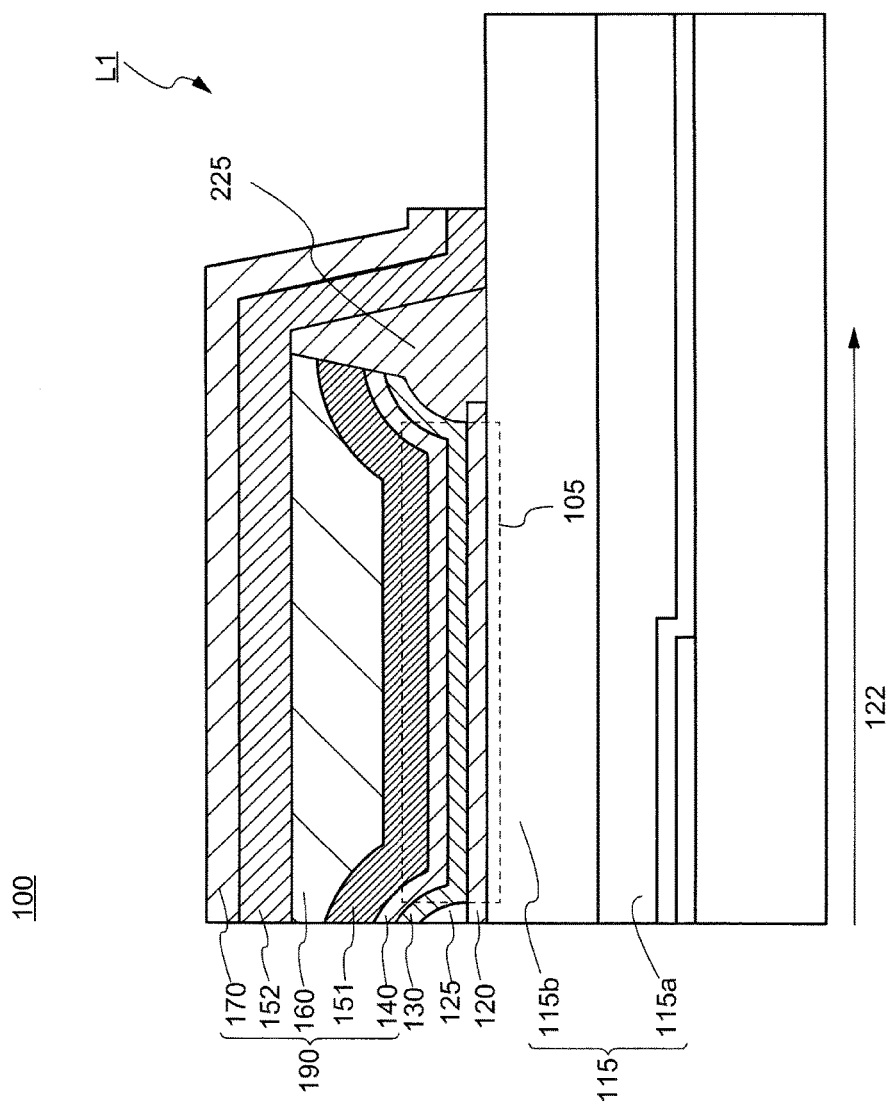
FIG. 6 is a cross-sectional diagram along the line D1-D2 in FIG. 1 with a filler material part omitted.

FIG. 6 is a cross-sectional diagram taken along the line D1-D2 in FIG. 1. Furthermore, in FIG. 6, the filler material 175 part shown in FIG. 1 is omitted. As is shown in FIG. 6, a dam 225 may be formed between the insulating layer 115 and the second inorganic insulating layer 152 at the end part of the piezoelectric material layer 160 of the display device with an input function 100. In the case where the first inorganic insulating layer 151 and the second inorganic insulating layer 152 are not in contact between the pixels 122, it is possible to dam up the piezoelectric material layer 160 with the dam 225 by adopting the structure shown in FIG. 6. Although the dam 225 is arranged at a position adjacent to the pixel 122 located at the end of the display region L1 In FIG. 6, the arrangement of the dam 225 is not limited to this arrangement, and may be arranged anywhere in the display region L1.

2. Self-Capacitance Method

FIG. 7A and FIG. 7B are wiring diagrams of a display device 100 with a self-capacitance type input function. FIG. 7A exemplifies a case where the second electrode 140 is arranged on the entire surface of the display device with an input function 100. In the self-capacitance method which is used for position detection, for example, a capacitance C is generated between the second electrode 140 and the third electrode 170 when a user is not touching. When a user touches, a capacitance $\Delta C$ is generated between the finger of the user and the third electrode 170. Therefore, the electrostatic capacitance seen from the third electrode 170 is C+$\Delta C$. Therefore, a current value when charging and discharging the electrostatic capacitance C+$\Delta C$ increases. When a user touches, the position of the touch can be determined by detecting a change in the current value for charging and discharging the electrostatic capacitance seen from the third electrode 170.

In the case of the self-capacitance method, the second electrode 140 is formed on roughly the entire surface on the upper surface of the bank 125 and the organic layer 130. A piezoelectric material layer 160 is arranged above the second electrode 140. The division electrodes 170a to 170f which are obtained when the third electrode 170 is divided into a plurality are formed above the second electrode 140 and above the piezoelectric material layer 160. The third electrode 170 may be divided into a plurality corresponding to each of the plurality of divided first electrodes 120.

A FPC 150 is arranged on the side of the piezoelectric material layer 160. The third electrode 170 and the FPC 150 are electrically connected through the routing wiring 111 and a terminal part 104 (shown in FIG. 1). Furthermore, a driver IC 159 is connected to the FPC 150.

When a potential difference detected by the sensor part 190 which detects a potential difference between the potential of the upper surface and the potential of the lower surface of the piezoelectric material layer 160 is a first value or higher, the driver IC 159 (control circuit) determines that the piezoelectric material layer 160 has been pressed. When a potential difference detected by the sensor part 190 is less than a first value, the driver IC 159 (control circuit) determines that the piezoelectric material layer 160 has not been pressed.

In addition, the driver IC 159 (control circuit) detects the pressing amount when the potential difference detected by the sensor part 190 becomes the first value or higher. The FPC 150 may further include a circuit connected to the third electrode 170 and which detects a difference in a current value of the third electrode 170.

Figure 8:
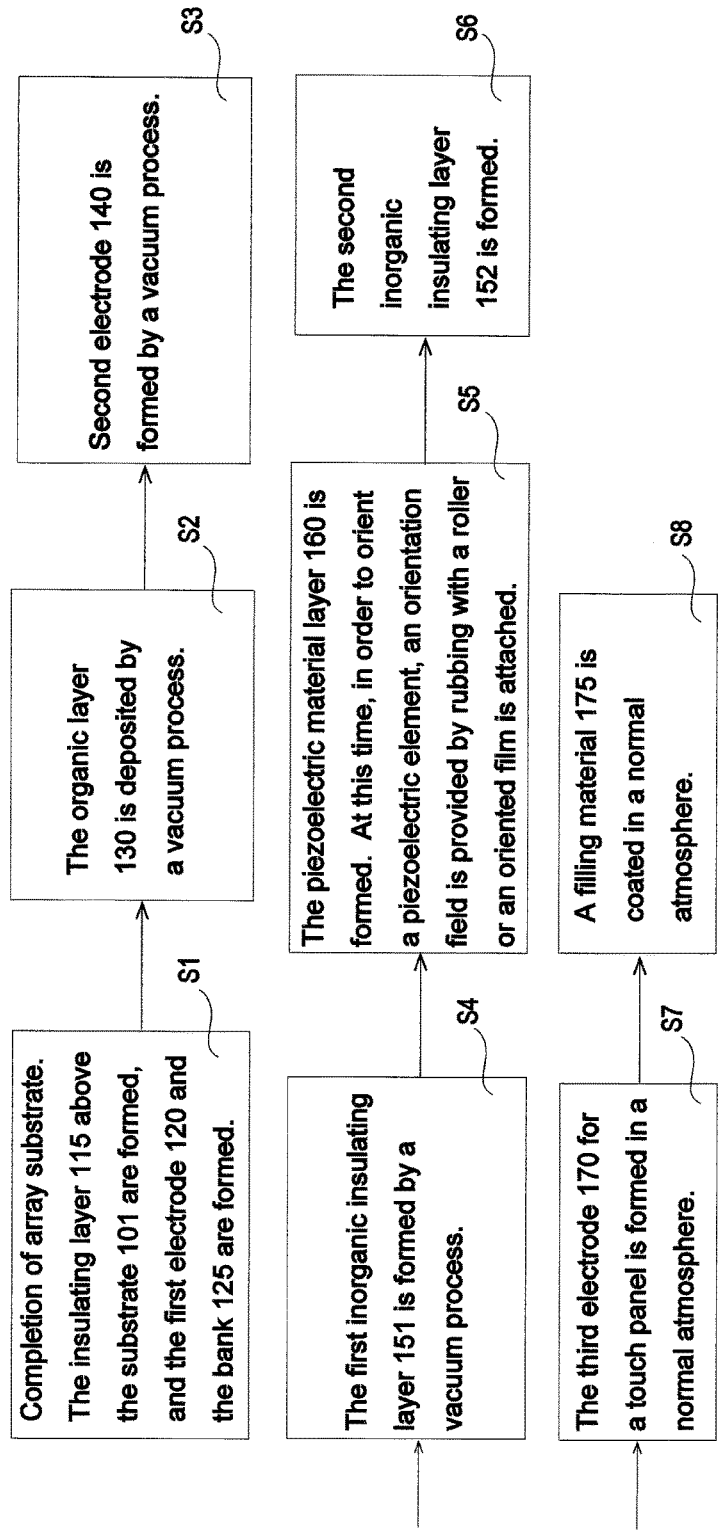
FIG. 8 is a flowchart showing a manufacturing process of a self-capacitance type display device with a wiring function related to a first embodiment of the present invention.

3. Manufacturing Process of Self-Capacitance Type Display Device with an Input Function FIG. 8 is a flowchart showing a manufacturing process of the self-capacitance type display device with an input function 100. First, as is shown in FIG. 8, the insulating layer 115 above the substrate 101 are formed, and the first electrode 120 and the bank 125 are formed (S1). Above this, the organic layer 130 is deposited by a vacuum process (S2). Above this, the second electrode 140 is formed by a vacuum process (S3).

Furthermore, the first inorganic insulating layer 151 is formed by a vacuum process (S4). Next, the piezoelectric material layer 160 is formed (S5). At this time, in order to orient a piezoelectric element, an orientation field is provided by rubbing with a roller or an oriented film is attached. Next, the second inorganic insulating layer 152 is formed (S6).

Next, the third electrode 170 for a touch panel is formed in a normal atmosphere (S7). Furthermore, a filling material 175 is coated in a normal atmosphere (S8). Furthermore, even if the organic layer 130 is not sealed by the first inorganic insulating layer 151, if the organic layer 130 is not deteriorated, the process of S4 may be omitted.

4. Mutual Capacitance Method

FIG. 7B is a wiring diagram of a mutual capacitance type display device with an input function 100 used in position detection. FIG. 7B exemplifies a case where the second electrode 140 is partially arranged by being patterned on the display device with an input function 100. In the mutual capacitance method, for example, when a user is not touching, electrostatic capacitance C is generated between the second electrode 140 and the third electrode 170. When a user touches, electrostatic capacitance C decreases by the capacitance ΔC generated by the finger of the user. Therefore, a current value when charging and discharging the electrostatic capacitance C-ΔC between the second electrode 140 and the third electrode 170 changes. When a user touches, it is possible to determine the position of the touch by detecting a difference in the current value.

In the case of the mutual capacitance method, the second electrode 140 is formed by a plurality of divided division electrodes 140a to 140f on the upper surface of the bank 125 and the organic layer 130. The piezoelectric material layer 160 is arranged above the division electrodes 140a to 140f. Above the piezoelectric material layer 160, the third electrode 170 is formed by a plurality of divided division electrodes 170a to 170f above the second electrode 140.

Each individual division electrode 140a to 140f and division electrodes 170a to 170f are arranged so as to mutually face each other in pairs.

The FPC 150 is arranged on the side of the piezoelectric material layer 160. The second electrode 140 and the FPC 150 are electrically connected to each other through the routing wiring 111 and the terminal part 104 (shown in FIG. 1). The third electrode 170 and the FPC 150 are electrically connected to each other through the routing wiring 112 and the terminal part 104 (shown in FIG. 1). A driver IC 159 is connected to the FPC 150.

When a potential difference detected by the sensor part 190 which detects a potential difference between the potential of the upper surface and the potential of the lower surface of the piezoelectric material layer 160 is a first value or higher, the driver IC 159 (control circuit) determines that the piezoelectric material layer 160 has been pressed. When a potential difference detected by the sensor part 190 is less than a first value, the driver IC 159 (control circuit) determines that the piezoelectric material layer 160 has not been pressed.

The driver IC 159 (control circuit) detects the pressing amount when the potential difference detected by the sensor part 190 becomes the first value or higher. The FPC 150 may further include a circuit connected to the third electrode 170 and which detects a difference in a current value of the third electrode 170.

Figure 9:
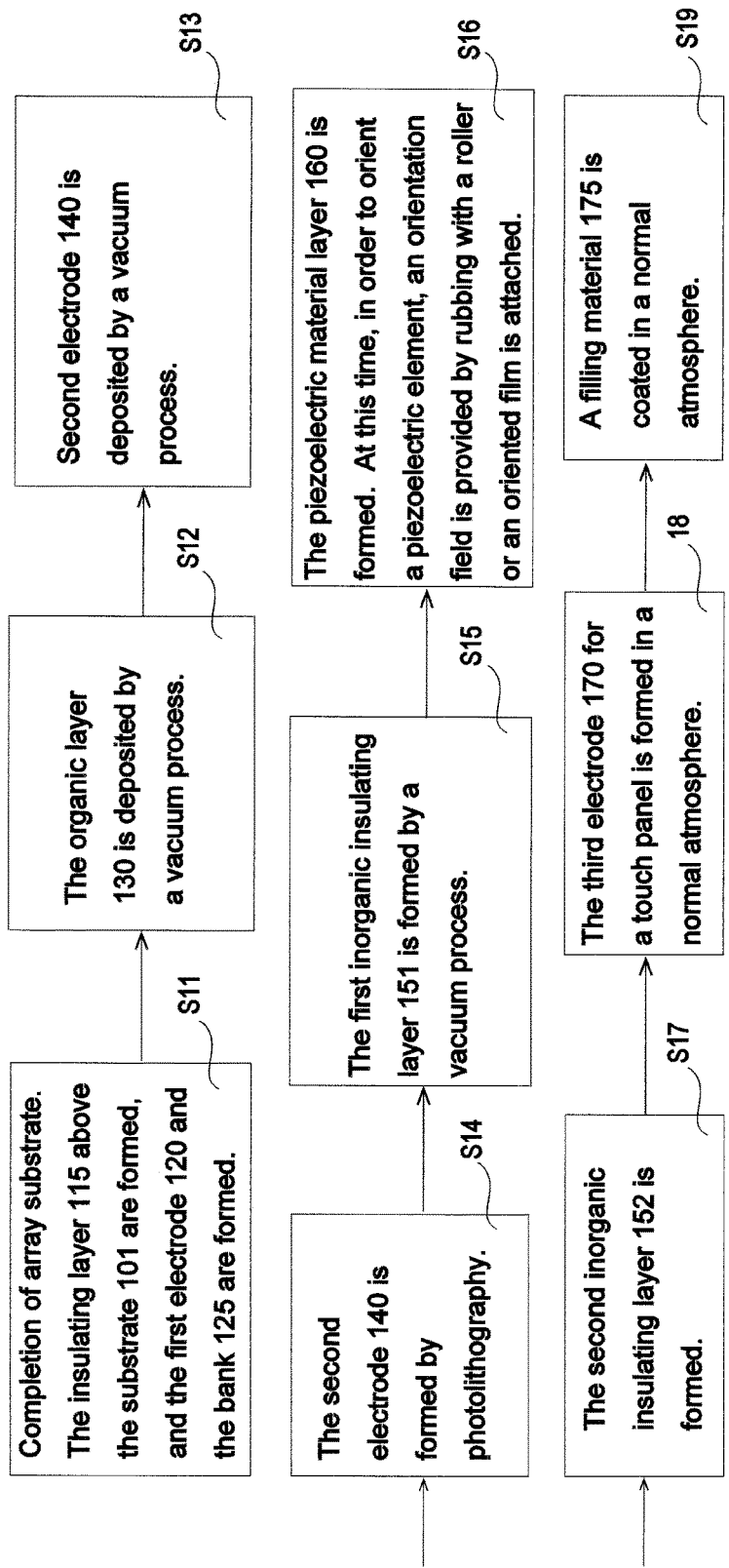
FIG. 9 is a flowchart showing a manufacturing process of a mutual-capacitance type display device with a wiring function related to a first embodiment of the present invention.

5. Manufacturing Process of Mutual Capacitance Type Display Device with an Input Function FIG. 9 is a flowchart showing a manufacturing process of the mutually capacitance type display device with an input function 100. First, a substrate 101 and the insulating layer 115 above the substrate 101 are formed and the first electrode 120 and the bank 125 are formed (S11). Above this, the organic layer 130 is deposited by a vacuum process (S12). Above this, the second electrode 140 is deposited by a vacuum process (S13).

Next, the second electrode 140 is formed by photolithography (S14). The organic layer 130 is formed by photolithography so that is does not deteriorate. Furthermore, a first inorganic insulating layer 151 is formed by a vacuum process (S15). Next, a piezoelectric material layer 160 is formed (S16). At this time, in order to orient a piezoelectric element, an orientation field is provided by rubbing with a roller or an oriented film is attached. Furthermore, a second inorganic insulating layer 152 is formed (S17).

Next, the third electrode 170 for a touch panel is formed in a normal atmosphere (S18). Furthermore, a filling material 175 is coated in a normal atmosphere (S19). Furthermore, even if the organic layer 130 is not sealed by the first inorganic insulating layer 151, if the organic layer 130 is not deteriorated, the process of S4 may be omitted.

According to the structure of the present embodiment, in the structure having the organic layer 130 and the touch panel structure, by using a part of a display element as an electrode, it is possible to reduce the number of electrodes. In addition, by arranging the piezoelectric material layer 160 between the second electrode 140 and the third electrode 170, it is possible to separately detect bending and touching according to a potential difference between an upper surface and a lower surface of the piezoelectric material layer 160.

<Embodiment 2>

Figure 10:
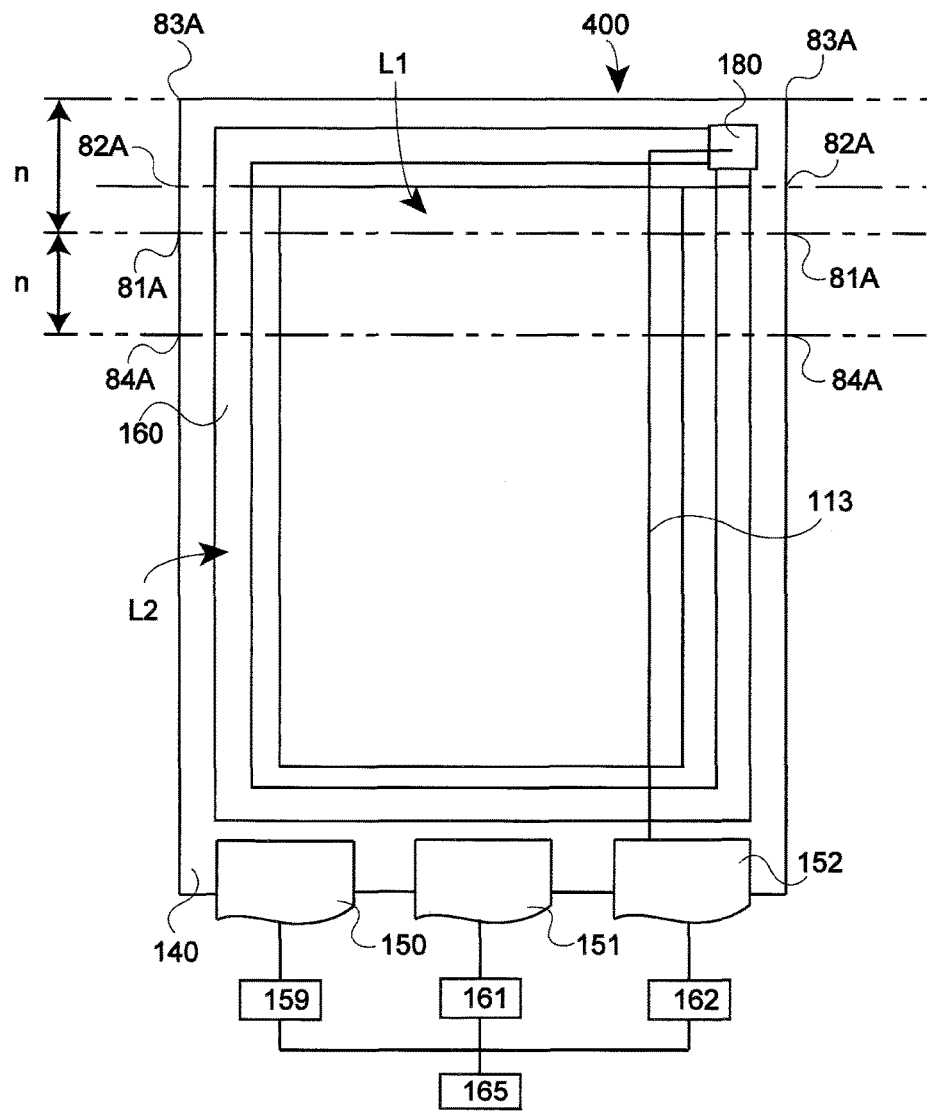
FIG. 10 is a schematic diagram of a display device with an input function related to a second embodiment of the present invention.

FIG. 10 is a schematic diagram of a display device with input function 400 according to the second embodiment. The display device with an input function 400 according to the second embodiment is different from the display device with an input function 100 of the first embodiment in that it includes a switching function of the display region L1 depending the presence or absence of bending of the piezoelectric material layer 160 in the non-display region L2.

The display device with an input function 400 comprises a detection part 180 which detects a potential difference between a potential of the upper surface and the potential of the lower surface of the piezoelectric material layer 160. The non-display region L2 is formed to cover a periphery of the display region L1. The detection part 180 is arranged in one part of the non-display region L 2. In addition, the detection part 180 is connected to routing wiring 113, FPC 152, driver IC 162 and a control circuit 165 in sequence. Furthermore, the second electrode 140 and the third electrode 170 are connected to the FPC 150, the driver IC 159 and the control circuit 165 in sequence. The first electrode 120 is connected to the FPC 151, the driver IC 161 and the control circuit 165 in sequence.

For example, the driver IC 162 determines that the piezoelectric material layer 160 in the non-display region L2 is bent when a potential difference detected by the detection part 180 is the second value or higher, turns on electricity to the first electrode 120 and the second electrode 140, and causes the organic layer 130 to emit light. The driver IC 159 causes the organic layer 130 to emit light when a part of the display device with an input function 400 is folded. Furthermore, a part of the display device with an input function 400 may be a corner part or an intermediate part of a side or the like.

The driver IC 162 determines that the piezoelectric material layer 160 is not bent when the potential difference detected by the detection part 180 is less than a second value and is equal to higher than the first value, and the driver IC 161 turns off electricity to the first electrode 120. By turning off electricity to the first electrode 120, the organic layer 130 does not emit light (pixels are turned off). When the display device with an input function 400 is returned to a flat state before bending, the driver IC 159 causes the organic layer 130 to emit light. The detection part 180 is electrically connected to the FPC 152 via the routing wiring 113 and the terminal part 104 (shown in FIG. 1).

Figure 11:
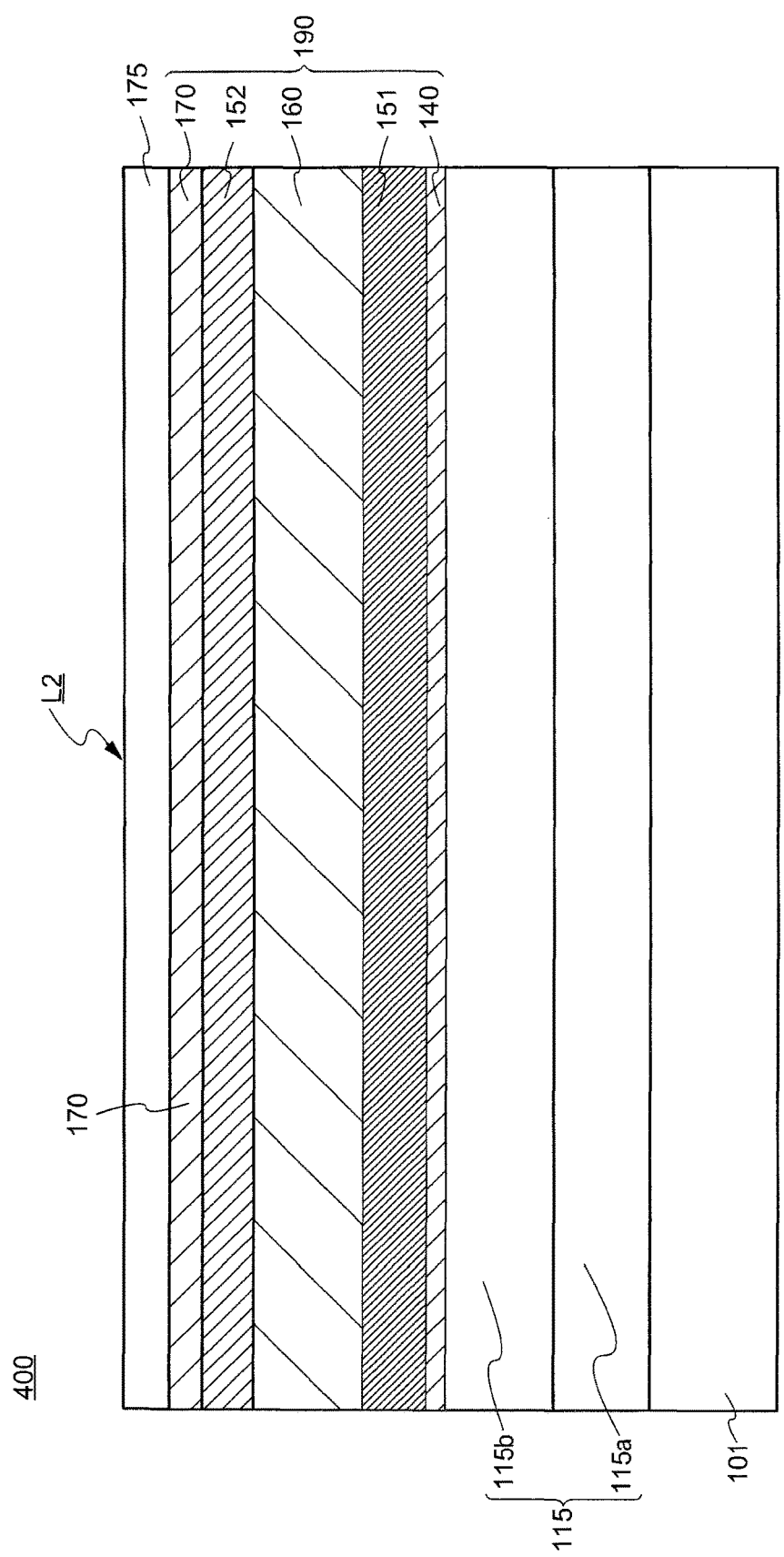
FIG. 11 is a cross-sectional diagram of a detection part.

FIG. 11 is a cross-sectional diagram of the detection part 180. The display device with an input function 400 including the detection part 180 comprises a substrate 101, a second electrode 140, a first inorganic insulating layer 151, a piezoelectric material layer 160, a second inorganic insulating layer 152 and a third electrode 170. The display region L1 in the display device with an input function 400 is different in that the first electrode 120 and the organic layer 130 are not arranged in the non-display region L2.

In the display device with an input function 400 is arranged with the insulating layer 115 above the substrate 101. A second electrode 140 is formed above the insulating layer 115. The first inorganic insulating layer 151 is arranged above the second electrode 140. The piezoelectric material layer 160 is arranged above the first inorganic insulating layer 151. The second inorganic insulating layer 152 is arranged above the piezoelectric material layer 160. The third electrode 170 is arranged above the second inorganic insulating layer 152.

According to the structure of the present embodiment, by comprising the detection part 180 which detects a potential difference between the potential of the upper surface and the potential of the lower surface of the piezoelectric material layer 160, it is possible to detect a potential difference according to the presence or absence of bending of the piezoelectric material layer 160. By making the potential difference dependent on the presence or absence of bending of the piezoelectric material layer 160 in the non-display region L2 corresponding to the light emission or non-light emission of an organic layer of a display region L1, it is possible to make bending of the piezoelectric material layer 160 in the non-display region L2 play the role of a switch for controlling light emission and non-light emission of an organic layer in the display region L1.

<Embodiment 3>

Figure 12:
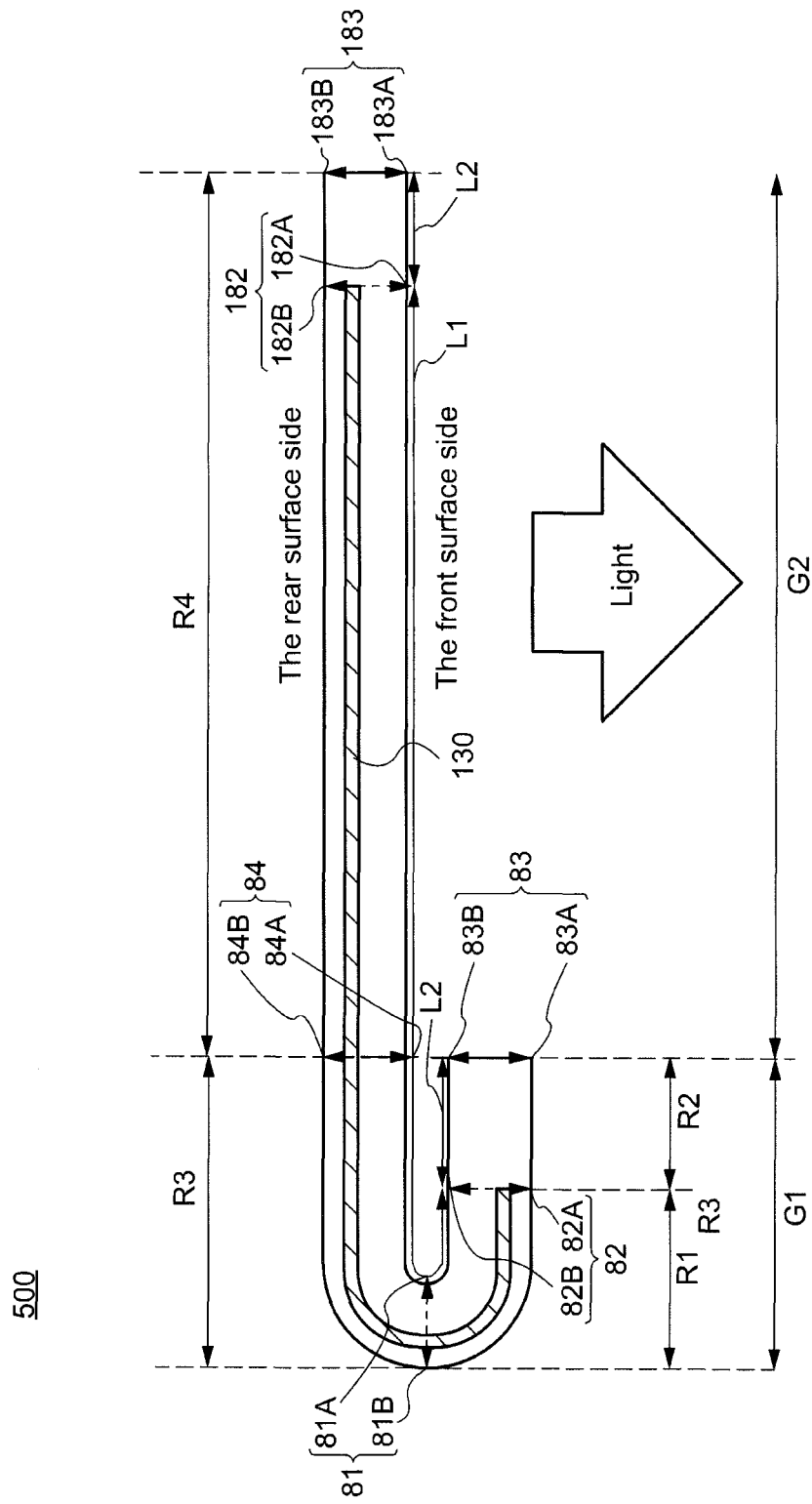
FIG. 12 is a cross-sectional diagram of a display device with an input function related to a third embodiment of the present invention.

FIG. 12 is a cross-sectional diagram of a display device with an input function 500 according to the third embodiment. In the display region L1 of the display device with the input function 500 of the third embodiment is different from the display device with input function 100 of the first embodiment in that the organic layer 130 does not emit light (pixels are turned off) in a region where the display surface becomes the inner side due to bending.

As is shown in FIG. 12, in the display device with an input function 500, light is emitted from the front surface side as shown by the arrow and is irradiated in a direction away from the display function with an input function 500. However, light is emitted from the display region L1 of the display device with input function 500 and not from the non-display region L2 of the display device with input function 500. In FIG. 12, a display region L1 and a non-display region L2 are provided on the front surface side of the display device with an input function 500. An organic layer 130 is arranged at a position corresponding to the display region L1. The organic layer 130 is not arranged at a position corresponding to the non-display region L2.

Here, a case is assumed in which a user bends the front surface side of the display device with an input function 500 to the inner side and bends the rear surface side of the display device 500 with an input function to the outer side.

The driver IC 159 determines a bent virtual surface 81 of the piezoelectric material layer 160 when the detection part 180 detects a region in which a potential difference between an upper surface (front surface side of the display function with display function device 500 in FIG. 12) and the lower surface (rear surface side of the display function attached display device 500 in FIG. 12) of the piezoelectric material layer 160 is a value of more than a second value larger than a first value. Here, the bent virtual face 81 is a plane linking a line part 81A on the front surface side of the display device with an input function 500 and a line part 81B on the rear surface side of the display device with an input function 500. Before the display device with an input function 500 is bent, the line part 81B is located roughly on the rear of the line part 81A.

In addition, the control circuit 165 performs control as follows. A case is assumed whereby the driver IC 159 determines that when the piezoelectric material layer 160 is bent forming the bent virtual surface 81, a potential difference of the bent virtual surface 81 detected by the detection part 180 is a second value or higher. The control circuit 165 controls the driver IC 161, and turns off electricity to the first electrode 120 included in mutually opposing regions G1 with the bent virtual surface plane 81 as an interface. In addition, the control circuit 159 turns on electricity to the first electrode 120 included in an opposing region G2 other than the opposing regions.

Here, in the region of the display region L1, the case of a display end planar region 82 which is closer to the bent virtual surface 81, and the case of a display end planar region 182 which is farther from the bent virtual surface 81 are considered. In addition, in the region of the non-display area L2, the case of a non-display end plane region 83 which is before the display end planar region 82, and the case of a non-display end planar area 183 which is before of the display end planar region 182 are considered.

A first region R1 between the bent virtual surface 81 and the display end planar region 82 closer to the bent virtual surface 81, and a second region R2 between the display end planar region 82 and the non-display end planar region 83 are recognized as a bent region. In addition, a third region R3 facing the first region R1 and the second region R2 is recognized as opposing region. Furthermore, in the display device with an input function 500, regions other than the first region R1, second region R2 and the third region R3 are recognized as the fourth region R4.

The driver IC 161 turns off the electricity to the first electrode 120 corresponding to the first region R1 and the third region R3 so that the organic layer 130 does not emit light (pixels are turned off). Simultaneously, the driver IC 161 turns on electricity to the first electrode 120 (shown in FIG. 2) corresponding to the fourth region R4 so that the organic layer 130 emits light.

That is, the driver IC 159 controls the display device with an input function 500, so that the organic layer 130 in the first region R1 and the third region R3 in which a display surface becomes a rear side (facing inward) due to bending does not emit light (pixels are turned off). In addition, so that the organic layer 130 of the fourth region R 4 located at a position visible from the exterior without being bent can emit light, the driver IC 159 controls the display device with an input function 500.

According to the structure of the present embodiment, by bending the display device with the input function, a light emitting element on a display surface facing inwards does not emit light, and a light emitting element on a display surface which does not bend emits light, and it is possible to control light emission and non-light emission of the display region L1.

What is claimed is:

1. A display device with an input function comprising:
 a substrate;
 a plurality of pixels arranged above the substrate;
 a light emitting element including a first electrode, a second electrode and an organic layer between the first electrode and the second electrode each arranged in the plurality of pixels; and
 a sensor part including the second electrode, a first inorganic insulating layer arranged above the second electrode, a piezoelectric layer arranged above the first inorganic insulating layer and without being directly connected with any electrodes, a second inorganic insulating layer arranged above the piezoelectric layer, and a third electrode arranged above the second inorganic insulating layer,
 wherein
 the plurality of pixels and the sensor part are arranged overlapping each other, and the second electrode is shared by the plurality of pixels and the sensor part.

2. The display device with an input function according to claim 1, wherein the substrate has flexibility.

3. The display device with an input function according to claim 1, wherein the second electrode is formed above an upper surface of the organic layer, and the third electrode is divided into a plurality at an upper surface of the second electrode through the piezoelectric layer.

4. The display device with an input function according to claim 1, wherein the second electrode is divided into a plurality at an upper surface of the organic layer, and the third electrode is divided into a plurality at an upper surface of the second electrode through the piezoelectric layer.

5. The display device with an input function according to claim 1, wherein the first electrode is divided into a plurality corresponding to each pixel.

6. The display device with an input function according to claim 4, wherein the third electrode corresponds to each of the second electrodes divided into a plurality.

7. The display device with an input function according to claim 1, wherein the second electrode serves also as an electrode of the light emitting element and an electrode of the sensor part.

8. The display device with an input function according to claim 1, further comprising:
 a display region including a plurality of the organic layers, and a non-display region separate from the display region,
 wherein
 the display region includes the first electrode, the organic layer, the second electrode, the first inorganic insulating layer, the piezoelectric layer, the second inorganic insulating layer and the third electrode; and
 the non-display region includes the second electrode, the first inorganic insulating layer, the piezoelectric layer, the second inorganic insulating layer and the third electrode.

9. The display device with an input function according to claim 1, further comprising:
 a detection part configured to detect a potential difference between a potential of an upper surface and a potential of a lower surface of the piezoelectric layer; and
 a control circuit configured to determine that the piezoelectric layer has been pressed when the potential difference detected by the detection part is a first value or higher, and determine that the piezoelectric layer has not been pressed when the potential difference detected by the detection part is less than the first value.

10. The display device with an input function according to claim 9, wherein the control circuit detects a pressed amount when a potential difference detected by the detection part is the first value or higher.

11. The display device with an input function according to claim 10, further comprising:
 a circuit connected to the third electrode and configured to detect a difference in a current value of the third electrode.

12. The display device with an input function according to claim 11, wherein the control circuit determines that the piezoelectric layer has been bent when the potential difference detected by the detection part is a second value larger than the first value or higher, determines that the piezoelectric layer has not been bent when electricity to the first electrode and the second electrode is switched ON to make the organic layer emit light and the potential difference detected by the detection part is the first value of higher and less than the second value, and electricity to the first electrode is switched OFF.

13. The display device with an input function according to claim 12, further comprising:
 a detection part configured to detect a potential difference between a potential of an upper surface and a potential of a lower surface of the piezoelectric layer; and
 a control circuit recognizes the potential difference of a bent virtual surface is the second value or more when the sensor part is bent and the bent virtual surface is formed, and the control circuit continues turning off electricity to the first electrode included in mutually opposing regions with the bent virtual surface as a boundary and turns on an electricity to the first electrode included in regions other than the opposing regions.

14. The display device with an input function according to claim 1, wherein the second electrode and the third electrode are transparent.

15. The display device with an input function according to claim 1, wherein pairs of end parts of the first inorganic insulating layer and the second inorganic insulating layer are adjacent or linked and enclose the piezoelectric layer in a cross-sectional view.

* * * * *